(12) United States Patent
Chen et al.

(10) Patent No.: US 9,596,749 B2
(45) Date of Patent: Mar. 14, 2017

(54) CIRCUIT BOARD HAVING A SIGNAL LAYER WITH SIGNAL TRACES AND A REFERENCE PLANE WITH AN ADDITIONAL SIGNAL TRACE LARGER THAN THE SIGNAL TRACES

(71) Applicant: Intel Corporation, Santa Clara, CA (US)

(72) Inventors: Kuan-Yu Chen, Hillsboro, OR (US); Yun Ling, Portland, OR (US); Mohd Muhaiyiddin Bin Abdullah, Kepala Batas (MY); Jackson Chung Peng Kong, Tanjung Tokong (MY); Chung-Hao Chen, Portland, OR (US); Hao-Han Hsu, Portland, OR (US); Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/567,916

(22) Filed: Dec. 11, 2014

(65) Prior Publication Data

US 2016/0174361 A1    Jun. 16, 2016

(51) Int. Cl.
| | |
|---|---|
| *H05K 1/02* | (2006.01) |
| *H01P 3/18* | (2006.01) |
| *H01P 3/02* | (2006.01) |
| *H05K 3/46* | (2006.01) |
| *H01P 11/00* | (2006.01) |

(52) U.S. Cl.
CPC ........... *H05K 1/0242* (2013.01); *H01P 3/026* (2013.01); *H01P 3/18* (2013.01); *H05K 1/0216* (2013.01); *H05K 1/0245* (2013.01); *H05K 3/4644* (2013.01); *H01P 11/003* (2013.01)

(58) Field of Classification Search
CPC ......... H01P 3/02; H01P 3/026; H05K 1/0242; H05K 1/0245
USPC ................................................. 333/1, 4, 5
See application file for complete search history.

(56) References Cited

U.S. PATENT DOCUMENTS

| | | | | |
|---|---|---|---|---|
| 2005/0099240 A1* | 5/2005 | Lin et al. | ................... | H01P 3/02 333/5 |
| 2009/0242244 A1* | 10/2009 | Hsu et al. | ............ | H05K 1/0245 174/255 |
| 2013/0038413 A1* | 2/2013 | Wu et al. | ................. | H04B 3/14 333/28 R |

\* cited by examiner

*Primary Examiner* — Benny Lee
(74) *Attorney, Agent, or Firm* — International IP Law Group, P.L.L.C.

(57) ABSTRACT

Techniques for routing signal traces in a circuit board are described. An example of an electronic device in accordance with the described techniques includes a circuit board comprising a plurality of conductive layers. The conductive layers include a signal layer and a reference plane. The signal layer includes signal traces and the reference plane includes an additional signal trace.

21 Claims, 8 Drawing Sheets

200

400

500

CIRCUIT BOARD HAVING A SIGNAL LAYER WITH SIGNAL TRACES AND A REFERENCE PLANE WITH AN ADDITIONAL SIGNAL TRACE LARGER THAN THE SIGNAL TRACES

FIELD

This disclosure pertains to computing systems, and in particular (but not exclusively) to techniques for routing signal traces in circuit boards.

BACKGROUND

Transmission of electrical signals in a circuit board can result in energy loss. The energy loss is usually dependent on the frequency of the transmission. For example, signal loss will generally be higher at higher frequencies. The signal loss variation across the frequency range of a signal can make it more difficult for signal receivers to recover the transmitted data. The total energy loss across a signal trace increases as a function of length. Thus, the energy loss imposes a limit on the possible length of a signal trace. To obtain longer length signal traces while maintaining acceptable signal characteristics, re-drivers and repeaters may be disposed along the length of the signal trace to boost the signal strength and equalize frequency dependent losses. Such repeaters and re-drivers use active circuit designs that increases circuit complexity and cost and consume additional power.

BRIEF DESCRIPTION OF THE FIGURES

The following detailed description may be better understood by referencing the accompanying drawings, which contain specific examples of numerous objects and features of the disclosed subject matter.

DETAILED DESCRIPTION OF EMBODIMENTS

Figure 1:
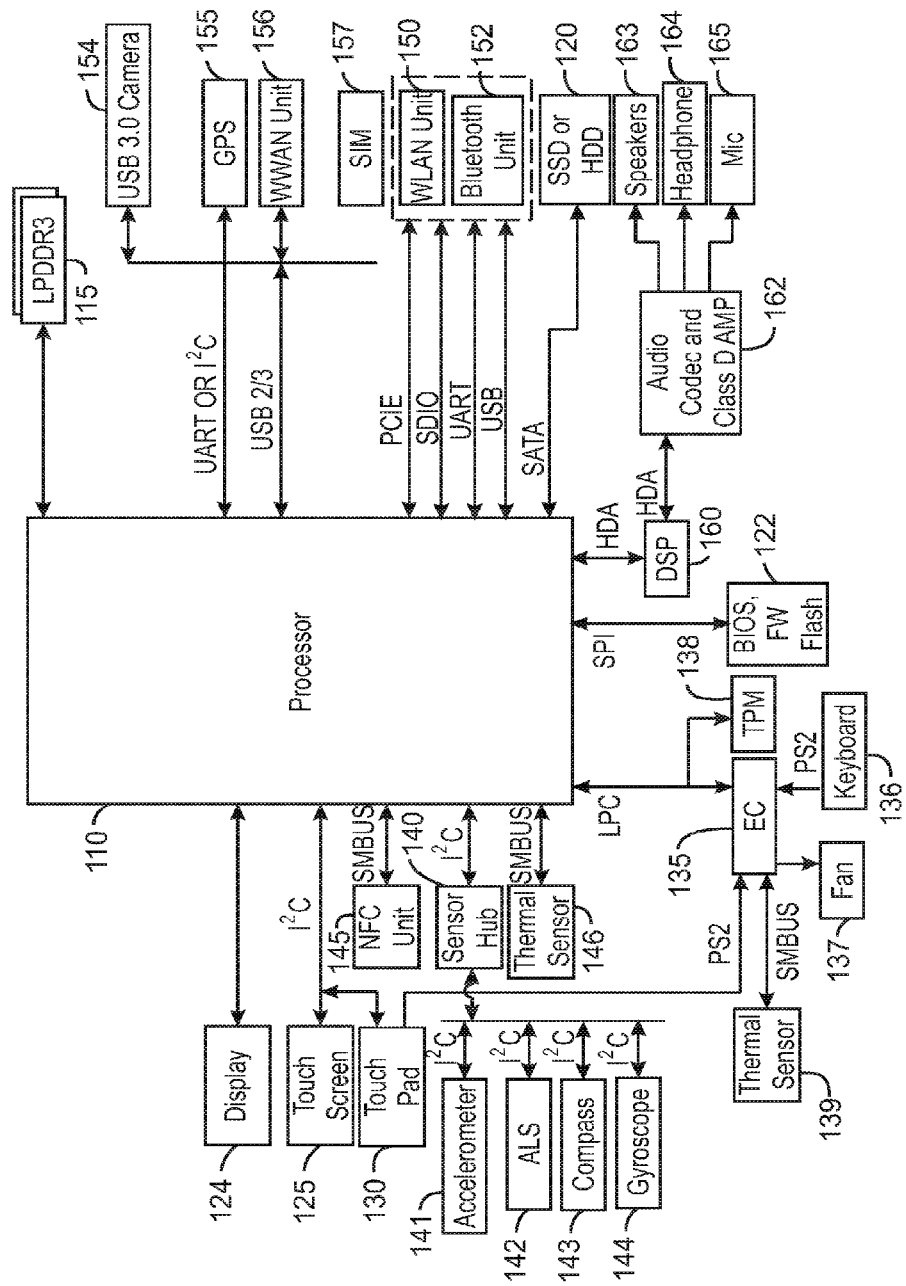
FIG. 1 illustrates an embodiment of a block diagram for a computing system.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or ULTRABOOKS™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

Referring now to FIG. 1, a block diagram of components present in a computer system in accordance with an embodiment of the present invention is illustrated. As shown in FIG. 1, system 100 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 1 is intended to show a high level view of many components of the computer system. However, it is to be understood that some of the components shown may be omitted, additional components may be present, and different arrangement of the components shown may occur in other implementations. As a result, the invention described above may be implemented in any portion of one or more of the interconnects illustrated or described below.

As seen in FIG. 1, a processor 110, in one embodiment, includes a microprocessor, multi-core processor, multi-threaded processor, an ultra low voltage processor, an embedded processor, or other known processing element. In the illustrated implementation, processor 110 acts as a main processing unit and central hub for communication with many of the various components of the system 100. As one example, processor 110 is implemented as a system on a chip (SoC). As a specific illustrative example, processor 110 includes an INTEL® ARCHITECTURE CORE™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent.

Processor 110, in one embodiment, communicates with a system memory 115. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (Q17P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 120 may also couple to processor 110. In various embodiments, to enable a thinner and lighter system design as well as to improve system responsiveness, this mass storage may be implemented via a Solid State Drive (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 1, a flash device 122 may be coupled to processor 110, e.g., via a serial peripheral interface (SPI). This flash device may provide for non-volatile storage of system software, including a basic input/output software (BIOS) as well as other firmware (FW) of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a SATA (i.e. Serial Advance Technology Attachment), Mini-SATA (mSATA), or NGFF (i.e. Next Generation Form Factor) slot. As an example, an SSD has a capacity ranging from 120 GB-1 TB.

Various input/output (IO) devices may be present within system 100. Specifically shown in the embodiment of FIG. 1 is a display 124 which may be a high definition LCD or LED panel configured within a lid portion of the chassis. This display panel may also provide for a touch screen 125, e.g., adapted externally over the display panel such that via a user's interaction with this touch screen, user inputs can be provided to the system to enable desired operations, e.g., with regard to the display of information, accessing of information and so forth. In one embodiment, display 124 may be coupled to processor 110 via a display interconnect that can be implemented as a high performance graphics interconnect. Touch screen 125 may be coupled to processor 110 via another interconnect, which in an embodiment can be an I$^2$C interconnect. As further shown in FIG. 1, in addition to touch screen 125, user input by way of touch can also occur via a touch pad 130 which may be configured within the chassis and may also be coupled to the same I$^2$C interconnect as touch screen 125.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits (i.e., 300 candela per square meter) brightness. Also the display may be of full high definition (HD) resolution (at least 1920×1080 p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., GORILLA GLASS™ or GORILLA GLASS 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 110 in different manners. Certain inertial and environmental sensors may couple to processor 110 through a sensor hub 140, e.g., via an I²C interconnect. In the embodiment shown in FIG. 1, these sensors may include an accelerometer 141, an ambient light sensor (ALS) 142, a compass 143 and a gyroscope 144. Other environmental sensors may include one or more thermal sensors 146 which in some embodiments couple to processor 110 via a system management bus (SMBus) bus.

Using the various inertial and environmental sensors present in a platform, many different implementations may be realized. These implementations enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other implementations may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second screen provides visual feedback to the user that the user has transitioned into a new state. Transition to a third screen may occur in a third state in which the user has confirmed recognition of the user identity.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the Operating system (OS) may be a MICROSOFT® WINDOWS® 8 OS that implements Connected Standby (also referred to herein as Win8 CS). WINDOWS® 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 1, various peripheral devices may couple to processor 110 via a low pin count (LPC) interconnect. In the embodiment shown, various components can be coupled through an embedded controller (EC) 135. Such components can include a keyboard 136 (e.g., coupled via a PS2 interface), a fan 137, and a thermal sensor 139 (e.g., coupled via a SMBus). In some embodiments, touch pad 130 may also couple to EC 135 via a PS2 interface. In addition, a security processor such as a trusted platform module (TPM) 138 in accordance with the Trusted Computing Group (TCG) TPM Specification Version 1.2, dated Oct. 2, 2003, may also couple to processor 110 via this LPC interconnect. However, understand the scope of the present invention is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), Revision 3.1 Specification, or later Universal Serial Bus specification, with at least one powered for charging of USB devices (such as smartphones) when the system is in Connected Standby state and is plugged into AC wall power. In addition, one or more peripheral ports such as THUNDERBOLT™ ports can be provided. Other ports may include an externally accessible card reader such as a full size SecureDigital-eXtended Capacity (SD-XC) card reader and/or a Subscriber Identity Module (SIM) card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 100 can communicate with external devices in a variety of manners, including wirelessly. In the embodiment shown in FIG. 1, various wireless modules, each of which can correspond to a radio configured for a particular wireless communication protocol, are present. One manner for wireless communication in a short range such as a near field may be via a near field communication (NFC) unit 145 which may communicate, in one embodiment with processor 110 via an SMBus. Note that via this NFC unit 145, devices in close proximity to each other can communicate. For example, a user can enable system 100 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 1, additional wireless units can include other short range wireless engines including a WLAN unit 150 and a Bluetooth unit 152. Using WLAN unit 150, Wi-Fi™ communications in accordance with a given Institute of Electrical and Electronics Engineers (IEEE) 802.11 standard can be realized, while via Bluetooth unit 152, short range communications via a Bluetooth protocol can occur. These units may communicate with processor 110 via, e.g., a USB link or a universal asynchronous receiver transmitter (UART) link. Or these units may couple to processor 110 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a Wireless Wide Area Network (WWAN) unit 156 which in turn may couple to a subscriber identity module (SIM) 157. In addition, to enable receipt and use of location information, a GPS module 155 may also be present. Note that in the embodiment shown in FIG. 1, WWAN unit 156 and an integrated capture device such as a camera module 154 may communicate via a given USB protocol such as a USB 2.0 or 3.0 link, or a UART or I²C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11 abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 160, which may couple to processor 110 via a high definition audio (HDA) link. Similarly, DSP 160 may communicate with an integrated coder/decoder (CODEC) and amplifier 162 that in turn may couple to output speakers 163 which may be implemented within the chassis. Similarly, amplifier and CODEC 162 can be coupled to receive audio inputs from a microphone 165 which in an embodiment can be implemented via dual array microphones (such as a digital microphone array) to provide for high quality audio inputs to enable voice-activated control of various operations within the system. Note also that audio outputs can be provided from amplifier/CODEC 162 to a headphone jack 164. Although shown with these particular components in the embodiment of FIG. 1, understand the scope of the present invention is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 110 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 135. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered down or off when the processor enters certain deep sleep states, the sustain power plane remains powered on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 135 may be sent to the PCH instead of the processor during the connected standby state so that the PCH can manage the wakeup processing instead of the processor. In addition, the TSC is maintained in the PCH to facilitate sustaining processor architectural functions. Although shown with these particular components in the embodiment of FIG. 1, understand the scope of the present invention is not limited in this regard.

Power control in the processor can lead to enhanced power savings. For example, power can be dynamically allocate between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours. A platform in one implementation may have an energy capacity of, e.g., 35 watt hours (Whr) for a Win8 CS using an SSD and (e.g.,) 40-44 Whr for Win8 CS using an HDD with a RST cache configuration.

A particular implementation may provide support for 15 W nominal CPU thermal design power (TDP), with a configurable CPU TDP of up to approximately 25 W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C.). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

Some or all of the components described in FIG. 1 are communicatively coupled via conductive signal traces disposed in or on a circuit board, such as a Printed Circuit Board (PCB). Various techniques for routing these signal traces over a circuit board are discussed in more detail below. Furthermore, it should be understood that the system 100 of FIG. 1 is just one example of system in which the present techniques may be implemented. Indeed, the techniques described herein can be used in any electronic device that uses a multiple-layer circuit board. Such electronic devices may include server computers, desktop computers, laptop computers, tablet computers, and smart phones, among others.

Figure 2:
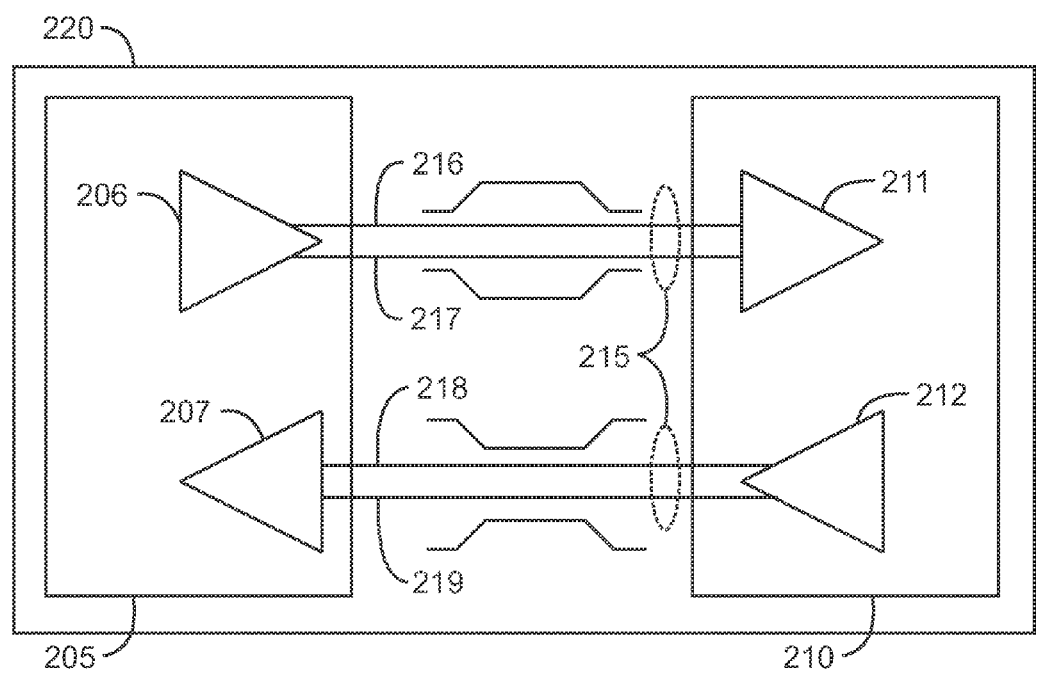
FIG. 2 illustrates an embodiment of a transmitter and receiver pair for an interconnect with signal traces disposed on a circuit board.

Referring next to FIG. 2, an embodiment of a serial point to point fabric is illustrated. Although an embodiment of a serial point-to-point link 200 is illustrated, a serial point-to-point link is not so limited, as it includes any transmission path for transmitting data. In the embodiment shown, a basic link includes two, low-voltage, differentially driven signal pairs: a transmit pair that includes transmission logic 206/212 and a receive pair that includes receiving logic 211/207. Accordingly, device 205 includes transmission logic 206 to transmit data to device 210 and receiving logic 207 to receive data from device 210, while device 210 includes transmission logic 212 to transmit data to device 205 and receiving logic 211 to receive data from device 205. In other words, two transmitting paths, i.e. lines 216 and 217, and two receiving paths, i.e. lines 218 and 219, are included in the link. In some embodiments, the device 205 and the device 210 are components of the system 100 of FIG. 1, which are communicatively coupled through a circuit board 220 using any of the communication protocols identified in relation to FIG. 1.

A transmission path refers to any path for transmitting data, such as a transmission line, a copper line, or other communication path. A connection between two devices, such as device 205 and device 210, is referred to as a link, such as links 215. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 216 and 217, to transmit differential signals. As an example, when line 216 toggles from a low voltage level to a high voltage level, i.e. a rising edge, line 217 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for a better timing window, which enables faster transmission frequencies. In the example of FIG. 2, the links

215 may be any suitable type of link, including USB 2.0, USB 3.0, USB 3.1, PCIe, Ethernet, HDMI, and others.

One factor that tends to limit the performance of some communication paths is insertion loss, which describes the loss of signal magnitude across a transmission path. As the frequency of a signal increases, the insertion loss also tends to increase, which may be due to the signal traces disposed on the circuit board 220. The insertion loss tends to impose a limit on the signal trace length that is possible before a loss in signal integrity occurs. For example, the USB 3.0 protocol can transmit data at speeds of up to approximately 5 Gigabits per second (Gbps), which typically imposes in a routing length limit of approximately 10 inches. By comparison, the USB 3.1 protocol can transmit data at up to approximately 10 Gbps, which may impose a routing length limit of approximately 6 to 7 inches. The loss of signal integrity may be mitigated through the use of repeaters, which can be used to increase signal strength and retime the differential signals. However, the addition of repeaters adds cost to the system.

The techniques described herein enable the fabrication of enlarged, e.g. wider and/or thicker, signal traces in a circuit board, which reduces the insertion loss. However, many of the signal traces in a circuit board may be short enough that the insertion loss experienced over those signal traces does not present a problem. Such signal traces may not substantially benefit by widening or thickening, which would reduce the effective use of the circuit board area. However, the techniques described herein enable selected signal traces to widened and/or thickened without a complete redesign of existing circuit board designs. Thus, the widening and thickening can be selectively applied to longer signal traces, while maintaining the existing configurations for shorter signal traces, or combination of both to meet the required loss budget. By increasing the size of longer signal traces, the use of repeaters can be avoided, which can reduce the cost of the system as well the power consumption.

Figure 3:
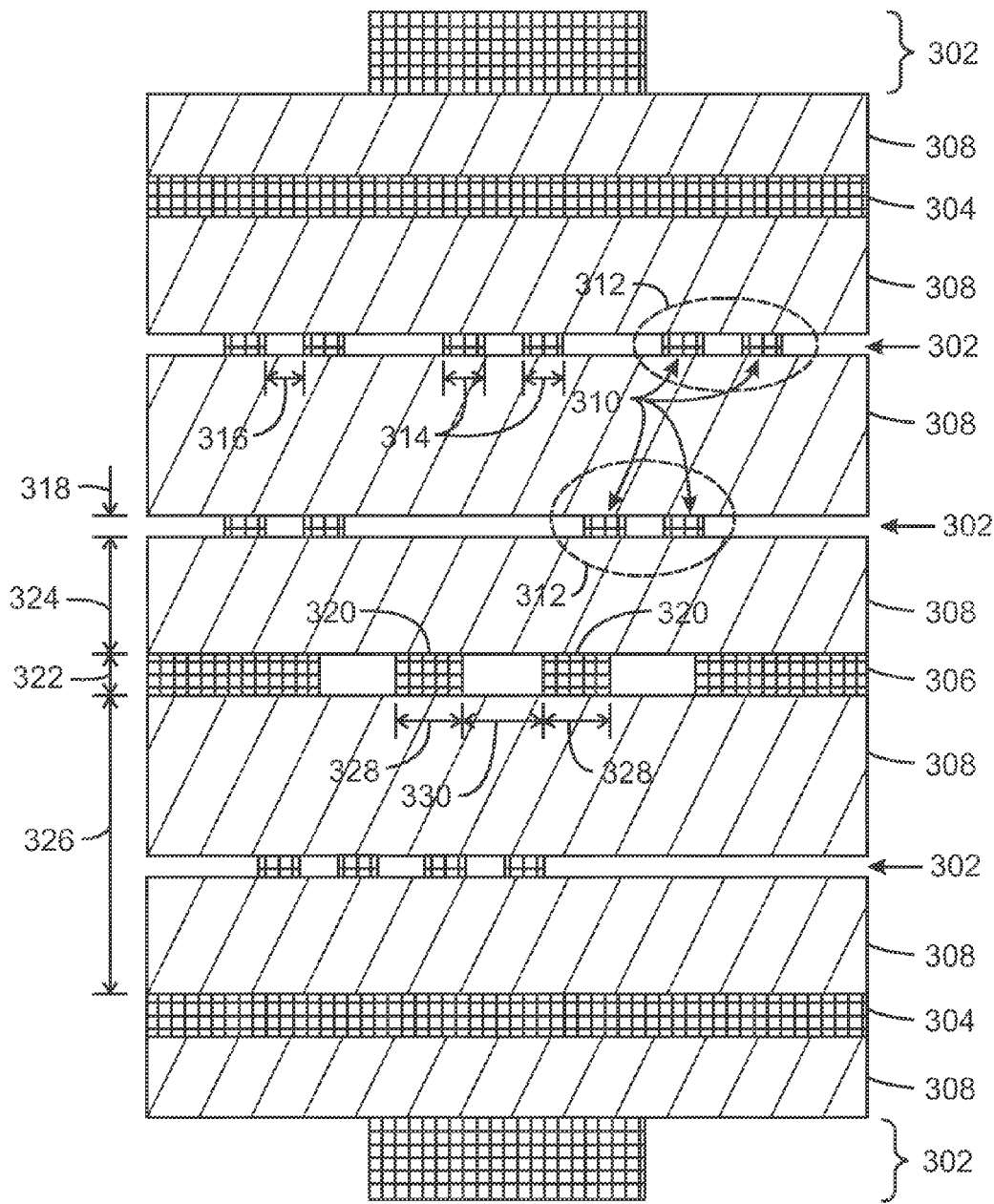
FIG. 3 is a cross sectional view of an eight-layer circuit board with enlarged signal traces.
Figure 4:
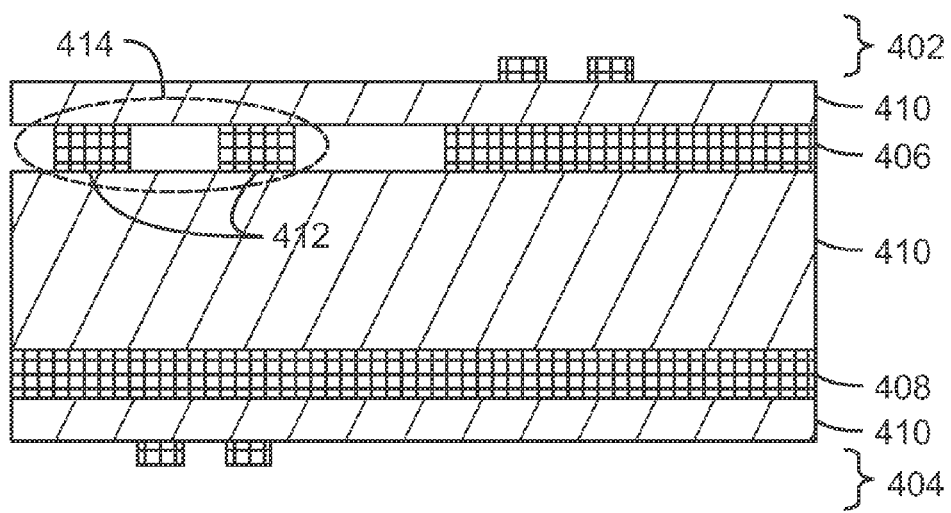
FIG. 4 is an example of a four-layer circuit board with enlarged signal traces.
Figure 5:
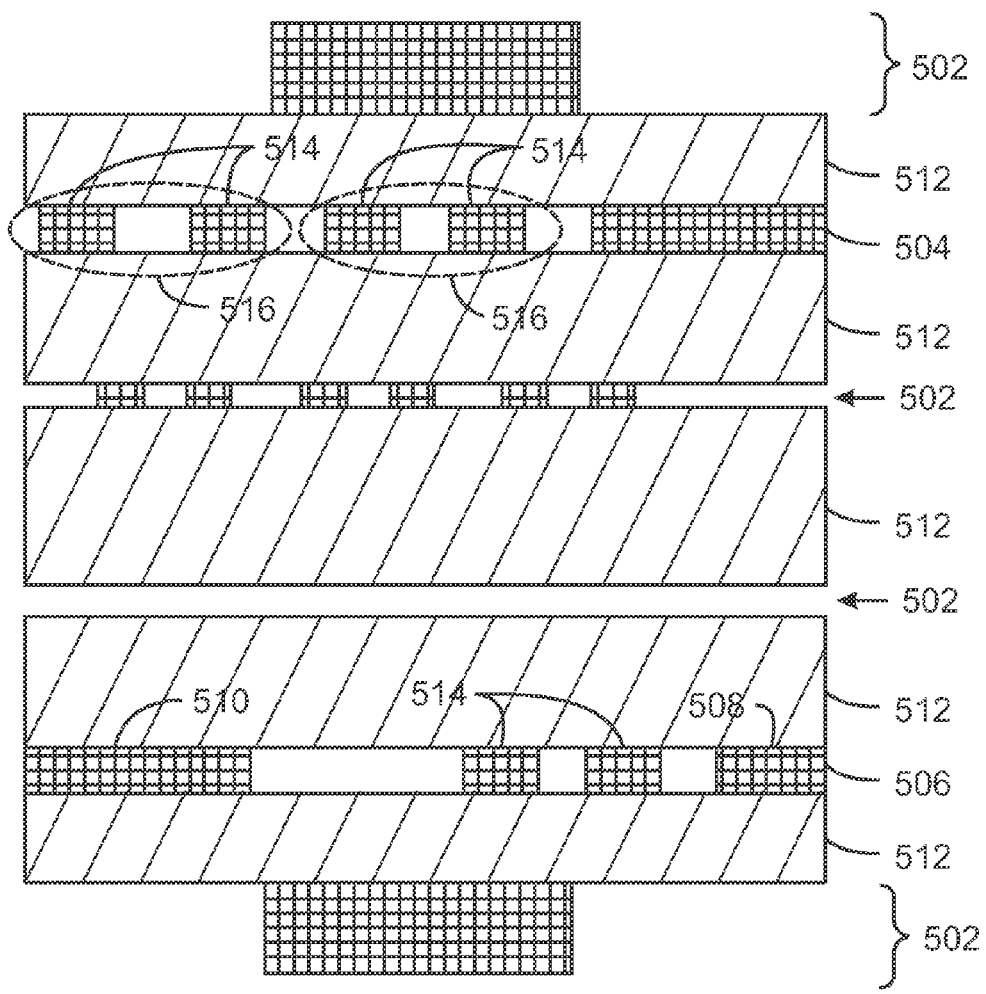
FIG. 5 is an example of a six-layer circuit board with enlarged signal traces.

FIG. 3 is a cross sectional view of an eight-layer circuit board with enlarged signal traces. The circuit board 300 of FIG. 3 is only one example of a circuit board that may benefit from the present techniques. It is to be understood that the present techniques can be used in any multiple-layer circuit board and different arrangement of the components shown may implemented in other embodiments. For example, fewer or more signal traces may be present and may be disposed in a variety of routing configurations. Additionally, the circuit board may include fewer or more layers, examples of which are shown in FIGS. 4 and 5. Furthermore, the specific dimensions presented herein are provided as an example to enable comparison, and it will be understood that the techniques are not limited to the specific dimensions described herein.

The example circuit board of FIG. 3 includes eight electrically conductive layers, including five signal layers 302, two ground planes 304, and a power plane 306. Each of the electrically conductive layers is separated by a dielectric layer 308. The signal layers 302 include signal traces 310, which enable communication between various components. Some or all of the signal layers 302 may include an insulative material that separates the signal traces 310, or the signal traces 310 may be separated by a void. The power plane 306 provides Direct Current (DC) voltage for powering various components coupled to the circuit board 300. The ground planes 304 provide a return path for current from components coupled to the circuit board 300. In some examples, the power plane can also be used as a ground plane for Alternating Current (AC) signals. The ground planes 304 and power plane 306 are relatively thicker compared to the signal planes in order to handle higher currents. Ground planes and power planes may be referred to herein as reference planes. Additionally, although not shown, the conductive layers are also electrically coupled at selected points by vertical conductors, such as vias, to enable the routing of signals and electrical power across layers. The dielectric layers 308 can include any suitable type of dielectric material, which may be chosen based on its thermal, electrical, and/or mechanical characteristics.

Each signal trace shown in FIG. 3 may be a part of a differential pair 312. However, the circuit board 300 may also include other types of signal traces, including signal traces used for single-ended signaling. The electrical characteristics of a differential pair are affected by its geometry, such as the width of the traces, the spacing between the pair, and the spacing between the adjacent layers. For example, increasing the signal trace width will tend to decrease the characteristic impedance, or will be referred to herein as just impedance, while increasing the distance between the differential pair 312 and the nearest ground plane 304 or power plane 306 will tend to increase the impedance. The geometry is controlled to obtain a desired electrical impedance. In the example shown in FIG. 3, the differential pairs may be stripline or dual-stripline signal traces. Within the signal layers 302, the width 314 of each signal trace may be approximately 2 to 5 thousandths of an inch (mils), the gap 316 between signal traces of a differential pair may be approximately 4 mils, and the height 318 of the signal layers 302 and the signal traces 310 may be approximately 0.4 to 0.6 mils.

The example circuit board 300 also includes enlarged signal traces 320, which are disposed in the reference plane 306. The enlarged signal traces 320 form another differential pair. To form the enlarged signal traces 320, a portion of the reference plane 306 is removed to provide space for the enlarged signal traces 320. In some examples, the thickness 322 of the reference plane 306 may be approximately 1.2 to 1.6 mils. Thus, the enlarged signal traces 320 are also 1.2 to 1.6 mils thick, which is at least two times the thickness of the signal traces 310 in the signal layers 302. In some examples, the enlarged signal traces 320 are 2 to 4 times the thickness of the signal traces 310 in the signal layers 302.

Additionally, by placing the enlarged signal traces 320 within the reference plane 306, the distance between the enlarged signal traces 320 to the adjacent ground planes 304 is increased. This enables the width 328 of the enlarged signal traces 320 to be increased in order to maintain the desired impedance. In the example shown in FIG. 3, the distance 324 between one of the signal layers 302 and the reference plane 306 may be approximately 3.5 mils. By contrast, the distance 326 between the enlarged signal traces 320 and the nearest ground plane 304 may be approximately 9.1 mils. The increased distance between the enlarged signal traces 320 and nearest ground plane enables the width of the signal traces to be increased. For example, the width 328 of the enlarged signal traces 320 may be approximately 8 to 10 mils, which is at least two times the width of the signal traces 310 in the signal layers 302, and the gap 330 between the enlarged signal traces 320 may be approximately 7 to 10 mils. In some examples, the enlarged signal traces 320 are 2 to 4 times as wide as the signal traces 310 in the signal layers 302. Thus, in the example shown in FIG. 3, the cross sectional area of the enlarged signal traces is approximately 4 to 16 times the cross sectional area of the signal traces in the signal layer. Furthermore, the enlarged signal traces 320 may exhibit the same or similar impedance compared to the signal traces 310 disposed in the signal layers 302.

In some examples, angle routing can be used to reduce crosstalk between the enlarged signal traces 320 and other signal traces in the signal layers 302. In angle routing, signal traces in adjacent layers are angled with respect to one another as viewed from above, which prevents the signal traces from being parallel to one another. In some examples, the enlarged signal traces 320 are angled with respect to each of the other signal traces 310 in the signal layers 302. The angle may be approximately 30 to 60 degrees, for example.

By disposing the enlarged signal traces 320 within a portion of the reference layer 306, the enlarged signal traces 320 can be enlarged without substantial changes to the other layers. Furthermore, the layers of the circuit board 300 may all remain the same thickness relative to existing circuit board designs. Accordingly, the present techniques are simple and inexpensive to employ within existing circuit board configurations and manufacturing processes. It will be appreciated that the circuit board 300 of FIG. 3 is only one example of a circuit board with enlarged signal traces. Additional examples of circuit boards with enlarged circuit traces are shown in FIGS. 4 and 5.

FIG. 4 is an example of a four-layer circuit board with enlarged signal traces. The example circuit board of FIG. 4 includes four electrically conductive layers, including two signal layers 402 and 404 and two ground planes 406 and 408. Although referred to as ground planes, either one or both of the ground planes 406 and/or 408 may actually be power planes in some implementations. Furthermore, one or both of the ground planes may be a combination ground and power plane. In a combination ground and power plane, a part of the plane is used as a ground plane and a separate part of the plane is used as a power plane, which is electrically isolated from the ground plane. Each of the electrically conductive layers is separated by a dielectric layer 410. In FIG. 4, the signal layers 402 and 404 are on the outside of the circuit board 400 and the ground planes 406 and 408 are internal layers.

As shown in FIG. 4, the top ground plane 406 includes enlarged signal traces 412, which form a differential pair 414. The enlarged signal traces 412 may be coupled to the signal layer 402 through vias, for example. In some examples, the ground plane 408 may also include enlarged signal traces 412. Furthermore, any suitable number of enlarged signal traces 412 can be included in the same ground plane or power plane. Another example of a circuit board in accordance with embodiments of the present techniques is shown in FIG. 5.

FIG. 5 is an example of a six-layer circuit board with enlarged signal traces. The example circuit board 500 of FIG. 5 includes six electrically conductive layers, including four signal layers 502 and two ground planes 504 and 506. Although referred to as ground planes, either one or both of the ground planes 504 and/or 506 may actually be power planes or combination ground and power planes in some implementations. For example, the bottom ground plane 506 may include a first portion 508 that is configured as a power plane and a second portion 510 that is configured as a ground plane. Each of the electrically conductive layers is separated by a dielectric layer 512.

As shown in FIG. 5, the top ground plane 504 includes four enlarged signal traces 514, which form two differential pairs 516. The enlarged signal traces 514 may be coupled to the signal layers 502 above and/or below, through vias, for example. In this example, the bottom ground plane 506 also includes two enlarged signal traces 514. As mentioned above, any suitable number of enlarged signal traces 514 can be included in the same ground plane or power plane. For example, the bottom ground plane 506 could have more than two signal traces. Furthermore, one of the ground planes 504 or 506 may also include signal traces that are used for single-ended signaling.

The example circuit boards of FIGS. 3, 4, and 5 are merely provided as examples. An actual implementation may have more or fewer components than shown in either of the figures. Furthermore, any of the features shown in one figure may be combined with other features shown in the other figures.

Figure 6:
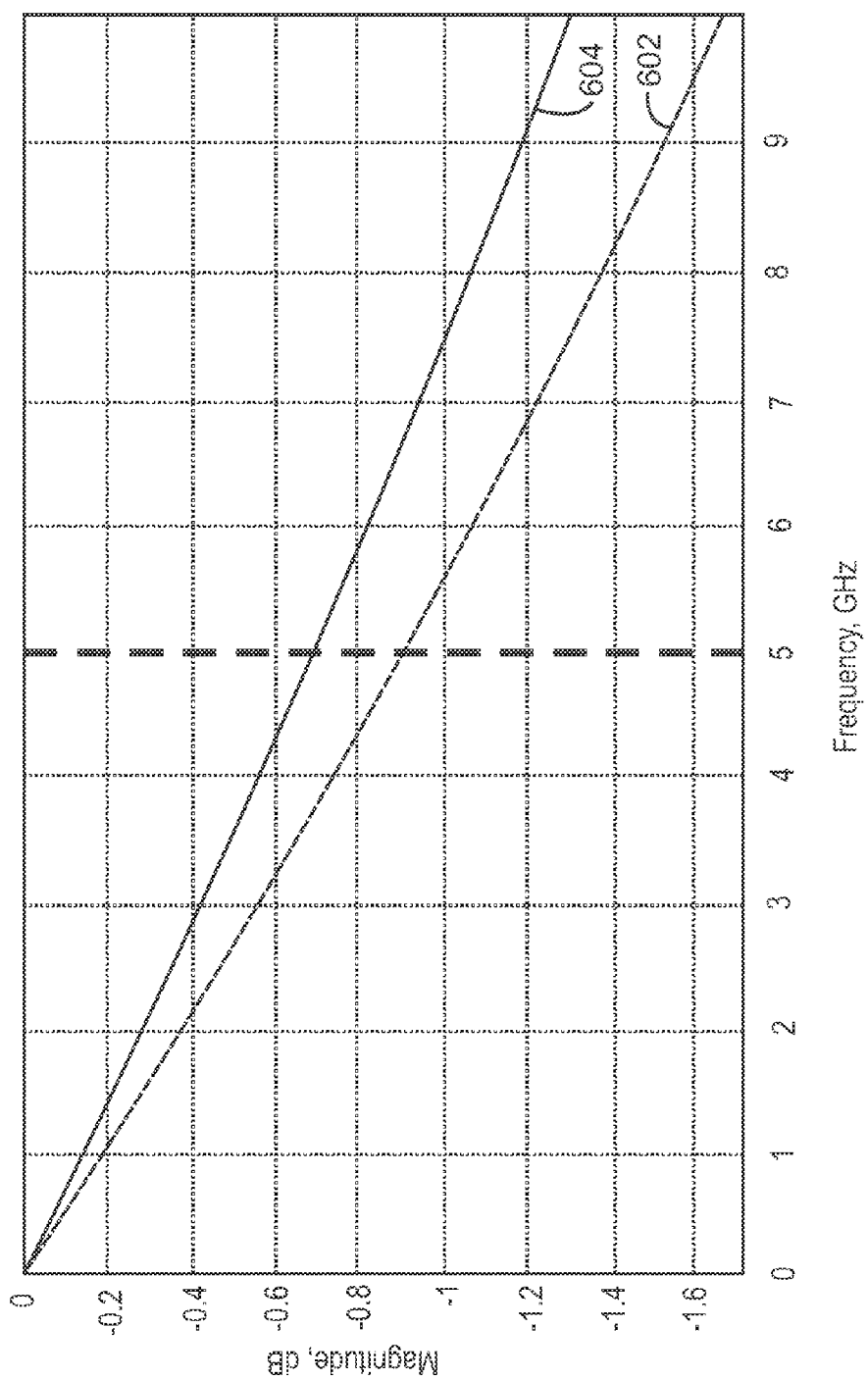
FIG. 6 is a graph of insertion loss for enlarged signal traces.

FIG. 6 is a graph of insertion loss for enlarged signal traces. More specifically, the graph 600 shows a computer simulated differential insertion loss for enlarged signal traces. The X-axis represents the frequency in GigaHertz (GHz), and the Y-axis represents the magnitude of the differential insertion loss in decibels (dB) over conductor length of one inch. The dashed line 602 shows the differential insertion loss for signal traces that are 4 mils wide and 0.6 mils thick. The solid line 604 shows the differential insertion loss for enlarged signal traces that are 9 mils wide and 1.2 mils thick. The graph 600 shows that at 5 GHz there is approximately a 0.24 dB improvement per inch in insertion loss for the enlarged signal traces compared to the smaller signal traces. Therefore, if the total length is 10 inch, the total improvement is about 2.4 dB.

Figure 7:
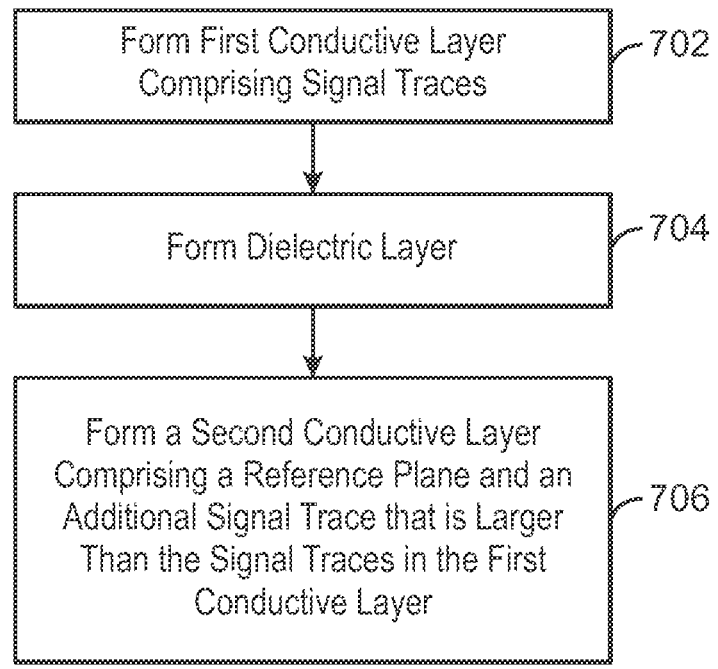
FIG. 7 is a process flow diagram of a method of manufacturing a circuit board, in accordance with embodiments.

FIG. 7 is a process flow diagram of a method of manufacturing a circuit board, in accordance with embodiments. The method 700 may used to manufacture a circuit board that includes an enlarged signal trace within a reference layer on an internal layer of the circuit board, which may be a ground plane, a power plane, or a combination ground and power plane. It will be understood that the method described herein can include many additional fabrication details. Furthermore, the method 700 should not be interpreted as implying that the actions have to be performed in any specific order.

At block 702, a conductive layer is formed, which includes signal traces and is referred to herein as a signal layer. The signal traces may be formed using any suitable fabrication techniques, including metal deposition, patterning, and etching, for example. The conductive layers of blocks 702 and 706 may be made from any suitable conductive material, including conductive polymers and metals such as copper, gold, aluminum, and others. The conductive layer of blocks 702 and 706 may be formed over a dielectric layer, including the dielectric layer described in relation to block 704.

At block 704, a dielectric layer is formed. The dielectric layer may be any suitable electrical insulator, such as polytetrafluoroethylene (Teflon) or a resin impregnated cloth (pre-preg), including FR-2, FR-4, CEM-1, CEM-2, and others. As noted above, block 702, 704 and 706 can be performed in any suitable order. Thus, the dielectric layer of block 704 may be formed over the conductive layer of block 702, or the conductive layer of block 702 may be formed over the dielectric layer of block 704. Furthermore, the layers described in blocks 702 and 704 may be directly contacting or there may be one or more intermediate layers in between.

At block 706, another conductive layer is formed, which includes a reference plane and at least one additional signal trace. The reference plane may be a ground plane, a power plane, or a combination ground and power plane. The additional signal trace in the layer with the reference plane is larger than the signal traces in the signal layer. For example, the cross section area of the additional signal trace may be approximately 2 to 6 times the cross sectional area of the signal traces in the signal layer. The additional signal trace may be used for single-ended signaling, or may be one of a pair of additional signal traces used for differential signaling. The pair of additional signal traces may exhibit approximately the same differential impedance as the signal traces in the signal layer, despite the differences in size. In some examples, the additional signal trace is angled relative to the signal traces in the signal layer to reduce the cross-talk between the additional signal trace and the signal traces in the signal layer.

As explained above, the additional signal trace disposed in the same layer as the reference plane exhibits reduced insertion loss compared to the smaller signal traces in the signal layers. Thus, the additional signal trace may be used in applications where insertion loss is a greater concern, such as higher frequency applications or applications that call for a longer trace length or both. In some examples, the length of the additional signal trace may be approximately 7 to 10 inches or greater and the additional signal trace may transmit signals with a frequency of approximately 5 to 10 Gigabits per second (Gbps) or greater.

It will be appreciated that any number of additional actions may be included within the method 700, depending on the specific application. For example, the method 700 may inlcude the formation of additional signal layers, reference layers, dielectric layers, signal traces, enlarged signal traces, vias, mounting structures, and passive electronic components, among others.

Figure 8:
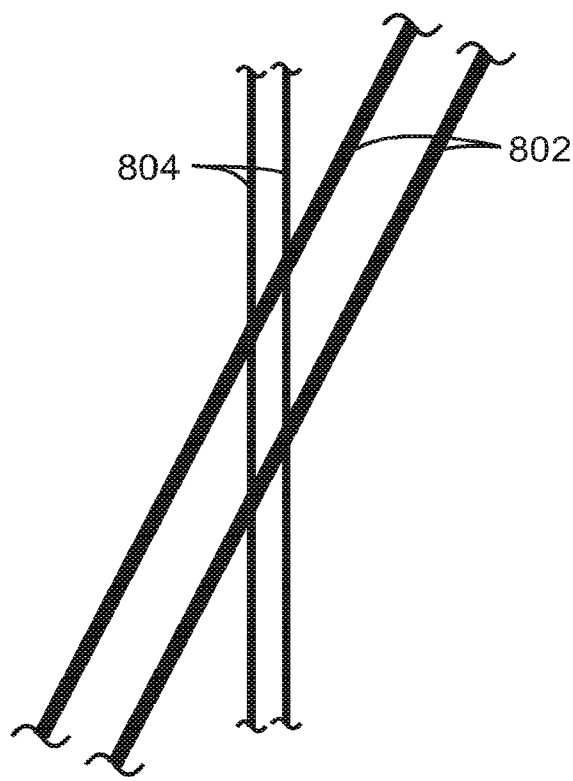
FIG. 8 is a top view of a portion of a circuit board with angled signal traces.

FIG. 8 is a top view of a portion of a circuit board with angled signal traces. As described above, angle routing can be used to reduce crosstalk between the enlarged signal traces in a reference layer and other signal traces in a signal layer. In angle routing, signal traces in adjacent layers are angled with respect to one another as viewed from above, which prevents the signal traces from being parallel to one another. In FIG. 8, the enlarged signal traces in the reference layer are shown with reference number 802 and the other signal traces in the signal layers are shown with reference number 804.

EXAMPLES

Examples may include subject matter such as a method, means for performing acts of the method, at least one machine-readable medium including instructions that, when performed by a machine cause the machine to performs acts of the method, or of an apparatus or system for managing power consumption according to embodiments and examples described herein.

Example 1 is an electronic device with improved signal routing. The electronic device includes a circuit board with a plurality of conductive layers. The plurality of conductive layers includes a signal layer with signal traces and a reference plane that includes an additional signal trace. Optionally, the additional signal trace can be one of a pair of additional signal traces for differential signaling. Optionally, the thickness of the additional signal trace is approximately 2 to 4 times the thickness of the signal traces in the signal layer. For example, the thickness of the signal traces in the signal layer may be approximately 0.4 to 0.6 mils while a thickness of the additional signal traces may be approximately 1.2 to 1.6 mils. Optionally, the width of the additional signal trace may be approximately 2 to 4 times the width of the signal traces in the signal layer. For example, a width of the signal traces in the signal layer may be approximately 2 to 5 mils while a width of the additional signal traces may be approximately 8 to 10 mils.

Example 2 is an electronic device that includes the subject matter of example 1, either including or omitting optional features, and wherein the pair of additional signal traces exhibit the same impedance as the signal traces in the signal layer.

Example 3 is an electronic device that includes the subject matter of example 1 or example 2, either including or omitting optional features, and wherein the additional signal trace is angled relative to the signal traces in the signal layer.

Example 4 is an electronic device that includes the subject matter of examples 1, 2, or 3, either including or omitting optional features, and wherein a length of the additional signal trace is greater than approximately 7 inches. Optionally, the additional signal trace is to transmit a differential signal with a frequency greater than approximately 5 Gigabits per second (Gbps). The additional signal trace can also be configured to transmit a Universal Serial Bus (USB) signal, including a USB signal at a frequency of 10 Gbps or greater.

Example 5 is a multiple-layer circuit board with improved signal routing. The circuit board includes a first conductive layer with signal traces and a second conductive layer separated from the first conductive layer by a dielectric layer. The second conductive layer is thicker than the first conductive layer and includes a reference plane and an additional signal trace. Optionally, the additional signal trace can be one of a pair of additional signal traces for differential signaling. Optionally, the thickness of the second conductive layer is approximately 2 to 4 times the thickness of the first conductive layer. For example, the thickness of the signal traces in the first conductive layer may be approximately 0.4 to 0.6 mils and a thickness of the additional signal trace may be approximately 1.2 to 1.6 mils. Optionally, the width of the additional signal trace may be approximately 2 to 4 times the width of the signal traces in the first conductive layer. For example, the width of the signal traces in the first conductive may be approximately 2 to 5 mils and a width of the additional signal trace may be approximately 8 to 10 mils.

Example 6 is a circuit board that includes the subject matter of example 5, either including or omitting optional features, and wherein the pair of additional signal traces exhibits the same impedance as the signal traces in the signal layer.

Example 7 is a circuit board that includes the subject matter of example 5 or example 6, either including or omitting optional features, and wherein the additional signal trace is angled relative to the signal traces in the first conductive.

Example 8 is a circuit board that includes the subject matter of examples 5, 6, or 7, either including or omitting optional features, and wherein a length of the additional signal trace is greater than approximately 7 inches and the additional signal trace is to transmit a differential signal with a frequency greater than 5 Gigabits per second. Optionally, the additional signal trace is to transmit a Universal Serial Bus (USB) signal. The additional signal trace may transmit the USB signal at a frequency of 10 Gbps or greater.

Example 9 is a method of manufacturing a printed circuit board (PCB) with improved signal routing. The method includes forming a first conductive layer with signal traces. The method also includes forming a dielectric layer. The method also includes forming a second conductive layer that includes a reference plane and an additional signal trace that is larger than the signal traces in the first conductive layer. Optionally, the additional signal trace is one of a pair of additional signal traces for differential signaling. A thickness of the second conductive layer may be approximately 2 to 4 times the thickness of the first conductive layer. For example, a thickness of the signal traces in the first conductive layer may be approximately 0.4 to 0.6 mils and a thickness of the additional signal trace may be approximately 1.2 to 1.6 mils. A width of the additional signal trace may be approximately 2 to 4 times the width of the signal traces in the first conductive layer. For example, a width of the signal traces in the first conductive layer may be approximately 2 to 5 mils and a width of the additional signal traces may be approximately 8 to 10 mils.

Example 10 is a method that includes the subject matter of example 9, either including or omitting optional features, wherein the pair of additional signal traces exhibit approximately a same impedance as the signal traces in the first conductive layer.

Example 11 is a method that includes the subject matter of example 9 or example 10, either including or omitting optional features, wherein forming the additional signal trace includes forming the additional signal trace at an angled relative to the signal traces in the first conductive layer.

Example 12 is a method that includes the subject matter of example 9, 10, or 11, either including or omitting optional features, wherein a length of the additional signal trace is greater than approximately 7 inches. Optionally, the additional signal trace of example 12 can transmit a differential signal with a frequency greater than 5 Gigabits per second. For example, the additional signal trace can transmit a Universal Serial Bus (USB) signal, including a USB signal at a frequency of 10 Gbps or greater.

Example 13 is an electronic device with improved signal routing. The electronic device includes a circuit board with a signal layer and a reference layer. The electronic device also includes a first electronic device coupled to the circuit board and a second electronic device coupled to the circuit board. The electronic device also includes a pair of differential signal traces to communicatively couple the first electronic device and the second electronic device. The pair of differential signal traces is disposed, at least partially, in the reference layer. Optionally, the length of the pair of differential signal traces can be greater than approximately 7 inches. Optionally, the pair of differential signal traces can transmit a differential signal with a frequency greater than 5 Gigabits per second (Gbps), for example, a frequency of approximately 10 Gbps or greater.

Example 14 is an electronic device that includes the subject matter of example 13, either including or omitting optional features, wherein the pair of differential signal traces is to transmit a Universal Serial Bus (USB) signal. Optionally, a thickness of the pair of differential signal traces may be approximately 1.2 to 1.6 mils, and a width of each one of the pair of differential signal traces may be approximately 8 to 10 mils.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A 'module' as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term 'module' (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of 'to,' 'capable to,' or 'operable to,' in one embodiment, refers to the latent state of an apparatus, logic, hardware, and/or element, where the apparatus, logic, hardware, and/or element is not operating but is designed in such a manner to enable use of an apparatus in a specified manner.

A 'value,' as used herein, includes any known representation of a number, a state, a logical state, or a binary logical state. Often, the use of logic levels, logic values, or logical values is also referred to as 1's and 0's, which simply represents binary logic states. For example, a '1' refers to a high logic level and '0' refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An electronic device, comprising:
   a circuit board comprising a plurality of conductive layers, the plurality of conductive layers comprising:
   a signal layer comprising signal traces; and
   a reference plane comprising an additional signal trace, wherein the additional signal trace is larger than the signal traces in the signal layer;
   wherein the additional signal trace is one of a pair of additional signal traces used for differential signaling and wherein the pair of additional signal traces have a same impedance as the signal traces in the signal layer.

2. The electronic device of claim 1, wherein a length of the additional signal trace is greater than approximately 7 inches and the additional signal trace is arranged to transmit a differential signal with a data rate greater than approximately 5 Gigabits per second (Gbps).

3. The electronic device of claim 1, wherein the additional signal trace is to transmit a 10 Gbps Universal Serial Bus (USB) signal.

4. The electronic device of claim 1, wherein a thickness of the additional signal trace is approximately 2 to 4 times the thickness of the respective signal traces in the signal layer.

5. The electronic device of claim 1, wherein a width of the additional signal trace is approximately 2 to 4 times the width of the respective signal traces in the signal layer.

6. The electronic device of claim 1, wherein a thickness of the respective signal traces in the signal layer is approximately 0.4 to 0.6 mils and a thickness of the additional signal trace is approximately 1.2 to 1.6 mils.

7. The electronic device of claim 1, wherein a width of the respective signal traces in the signal layer is approximately 2 to 5 mils and a width of the additional signal trace is approximately 8 to 10 mils.

8. The electronic device of claim 1, wherein the additional signal trace is angled relative to the respective signal traces in the signal layer.

9. A multiple-layer circuit board, comprising:
   a first conductive layer comprising signal traces; and
   a second conductive layer separated from the first conductive layer by a dielectric layer, the second conductive layer comprising a reference plane and an additional signal trace, wherein the second conductive layer is thicker than the first conductive layer;

wherein the additional signal trace is one of a pair of additional signal traces used for differential signaling and wherein the pair of additional signal traces have a same impedance as the signal traces in the first conductive layer.

10. The multiple-layer circuit board of claim 9, wherein the additional signal trace is angled relative to the respective signal traces in the first conductive layer.

11. The multiple-layer circuit board of claim 9, wherein a length of the additional signal trace is greater than approximately 7 inches and the additional signal trace is to transmit a differential signal with a data rate greater than 5 Gigabits per second.

12. The multiple-layer circuit board of claim 9, wherein the additional signal trace is to transmit a Universal Serial Bus (USB) signal.

13. The multiple-layer circuit board of claim 9, wherein a thickness of the second conductive layer is approximately 2 to 4 times the thickness of the first conductive layer and a width of the additional signal trace is approximately 2 to 4 times the width of the respective signal traces in the first conductive layer.

14. The multiple-layer circuit board of claim 9, wherein a thickness of the respective signal traces in the first conductive layer is approximately 0.4 to 0.6 mils and a thickness of the additional signal trace is approximately 1.2 to 1.6 mils.

15. The multiple-layer circuit board of claim 9, wherein a width of the respective signal traces in the first conductive layer is approximately 2 to 5 mils and a width of the additional signal trace is approximately 8 to 10 mils.

16. A method of manufacturing a printed circuit board (PCB), comprising:

forming a first conductive layer comprising signal traces;

forming a dielectric layer; and forming a second conductive layer comprising a reference plane and an additional signal trace that is larger than the respective signal traces in the first conductive layer;

wherein the additional signal trace is one of a pair of additional signal traces used for differential signaling and wherein the pair of additional signal traces have approximately a same impedance as the signal traces in the first conductive layer.

17. The method of claim 16, wherein a length of the additional signal trace is greater than approximately 7 inches and the additional signal trace is to transmit a differential signal with a data rate greater than 5 Gigabits per second.

18. The method of claim 16, wherein forming the additional signal trace comprises forming the additional signal trace at an angle relative to the signal traces in the first conductive layer.

19. The method of claim 16, wherein a width of the respective signal traces in the first conductive layer is approximately 2 to 5 mils and a width of the additional signal traces is approximately 8 to 10 mils.

20. The method of claim 16, wherein a thickness of the signal traces in the first conductive layer is approximately 0.4 to 0.6 mils and a thickness of the additional signal trace is approximately 1.2 to 1.6 mils.

21. The method of claim 16, wherein a thickness of the second conductive layer is approximately 2 to 4 times the thickness of the first conductive layer and a width of the additional signal trace is approximately 2 to 4 times the width of the respective signal traces in the first conductive layer.

* * * * *